US011423824B2

(12) United States Patent
Hu et al.

(10) Patent No.: US 11,423,824 B2
(45) Date of Patent: Aug. 23, 2022

(54) GATE DRIVER CIRCUIT OF DISPLAY PANEL, DRIVING METHOD THEREFOR AND DISPLAY DEVICE

(71) Applicants: Chuzhou HKC Optoelectronics Technology Co., Ltd., Chuzhou (CN); HKC CORPORATION LIMITED, Shenzhen (CN)

(72) Inventors: Yunqin Hu, Chuzhou (CN); Lidan Ye, Chuzhou (CN)

(73) Assignees: CHUZHOU HKC OPTOELECTRONICS TECHNOLOGY CO., LTD., Chuzhou (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/343,775

(22) Filed: Jun. 10, 2021

(65) Prior Publication Data

US 2022/0036800 A1 Feb. 3, 2022

(30) Foreign Application Priority Data

Jul. 31, 2020 (CN) .......................... 202010755366.5

(51) Int. Cl.
*G09G 3/20* (2006.01)

(52) U.S. Cl.
CPC ... *G09G 3/2092* (2013.01); *G09G 2310/0267* (2013.01); *G09G 2310/0286* (2013.01); *G09G 2310/08* (2013.01)

(58) Field of Classification Search
CPC ....... G09G 2230/00; G09G 2310/0254; G09G 2310/0264; G09G 2310/027; G09G 2310/08; G09G 2320/0223; G09G 2320/0252; G09G 3/3275; G09G 3/3614; G09G 3/3685; G09G 3/2092; G09G 2310/0267; G09G 2310/0286
See application file for complete search history.

(56) References Cited

U.S. PATENT DOCUMENTS

| | | | | |
|---|---|---|---|---|
| 6,891,422 B2* | 5/2005 | Shin | ................. | H03K 19/01714 327/333 |
| 7,778,379 B2* | 8/2010 | Liao | ....................... | G11C 19/28 377/64 |
| 7,859,508 B2* | 12/2010 | Yamashita | ........... | G09G 3/3677 345/100 |
| 7,949,086 B2* | 5/2011 | Tsai | ........................ | G11C 19/28 377/79 |
| 8,194,817 B2* | 6/2012 | Tobita | .................. | G09G 3/3677 377/64 |

(Continued)

*Primary Examiner* — Michael J Jansen, II

(57) ABSTRACT

The present application discloses a gate driver circuit of a display panel, a driving method therefor and a display circuit. The gate driver circuit of a display panel includes a multi-stage cascaded shift register, where an any-stage shift register includes: a charging circuit, a pull-down circuit for controlling to pull down a potential of an output terminal of the charging circuit to a low level in a non-scanning time, and an output control circuit electrically coupled to the output terminal of the charging circuit for receiving an initial gate scanning signal; the output control circuit is connected to an enable signal and controls the output of the gate scanning signal according to the enable signal.

17 Claims, 6 Drawing Sheets

(56) References Cited

U.S. PATENT DOCUMENTS

| | | | | |
|---|---|---|---|---|
| 8,477,094 B2* | 7/2013 | Jung | ................... | G11C 19/28 377/64 |
| 8,717,275 B2* | 5/2014 | Masui | ................... | G09G 3/20 345/100 |
| 9,444,450 B2* | 9/2016 | Xiao | ................... | H03K 17/687 |
| 9,892,703 B2* | 2/2018 | Tsuchi | ................... | H03F 3/45179 |
| 10,269,282 B2* | 4/2019 | Shan | ................... | G09G 3/20 |
| 10,339,854 B2* | 7/2019 | Yang | ................... | G09G 3/3677 |
| 10,438,676 B2* | 10/2019 | Zeng | ................... | G09G 3/3677 |
| 2004/0021496 A1* | 2/2004 | Shin | ................... | H03K 19/01714 327/333 |
| 2007/0057899 A1* | 3/2007 | Yamashita | ................... | G09G 3/3677 345/100 |
| 2009/0304139 A1* | 12/2009 | Tsai | ................... | G11C 19/28 377/79 |
| 2010/0134234 A1* | 6/2010 | Liao | ................... | G11C 19/28 377/54 |
| 2011/0142191 A1* | 6/2011 | Tobita | ................... | G09G 3/3677 377/64 |
| 2011/0157124 A1* | 6/2011 | Jung | ................... | G11C 19/28 345/211 |
| 2011/0228893 A1* | 9/2011 | Tobita | ................... | G11C 19/28 377/77 |
| 2012/0127152 A1* | 5/2012 | Masui | ................... | G09G 3/20 345/212 |
| 2014/0104152 A1* | 4/2014 | Ma | ................... | G09G 3/3677 345/100 |
| 2015/0194115 A1* | 7/2015 | Tsuchi | ................... | H03F 3/45179 345/212 |
| 2016/0164514 A1* | 6/2016 | Xiao | ................... | H03K 17/687 327/109 |
| 2018/0342187 A1* | 11/2018 | Shan | ................... | G11C 19/287 |
| 2019/0043412 A1* | 2/2019 | Yang | ................... | G09G 3/3677 |
| 2019/0103167 A1* | 4/2019 | Zeng | ................... | G09G 3/3677 |
| 2022/0036800 A1* | 2/2022 | Hu | ................... | G11C 19/28 |

* cited by examiner

GATE DRIVER CIRCUIT OF DISPLAY PANEL, DRIVING METHOD THEREFOR AND DISPLAY DEVICE

The present application claims priority to Chinese Patent Application No. 202010755366.5, filed Jul. 31, 2020, which is hereby incorporated by reference herein as if set forth in its entirety.

TECHNICAL FIELD

The present application relates to the technical field of display, particularly to a gate driver circuit of a display panel, a driving method therefor, and a display device.

BACKGROUND

The statements herein merely provide background information related to the present application and do not necessarily constitute the conventional art.

The display panel is widely used in such as a mobile phone, a Personal Digital Assistant (PDA), a digital camera, a computer screen or a notebook computer screen and the like due to its many advantages of thin body, power saving, free of radiation, and the like. In display panels with various architectures, a shift register gate on array (GOA) circuit has become mainstream due to the advantage of a narrow frame.

The gate scanning signal output to the display panel by each stage of shift register may generate a smear due to RC delay. Smear is the delayed falling edge of the gate scanning signal, which causes that the scanning line of the display panel is still turned on when it should have been turned off, and the pixel corresponding to the current scanning line is charged to the voltage of the pixel corresponding to the next scanning line in a wrong way, finally leading to wrong charging, insufficient charging, and poor display quality of the display panel.

SUMMARY

The purpose of the present application is to provide a gate driver circuit of a display panel, a driving method therefor and a display device so as to improve a smear and improve display quality.

The present application discloses a gate driver circuit of a display panel. The gate driver circuit of a display panel includes a multi-stage cascaded shift register, where an any-stage shift register includes a charging circuit, a pull-down circuit and an output control circuit; the charging circuit receives a clock signal and outputs an initial gate scanning signal in a scanning time; the pull-down circuit controls to pull down a potential of an output terminal of the charging circuit to a low level in a non-scanning dine; the output control circuit is electrically coupled to the output terminal of the charging circuit to receive an initial gate scanning signal, connected to an enable signal and controls the output of the gate scanning signal according to the enable signal; where when a current-stage initial gate scanning signal is switched from a high level to a low level, the enable signal is a rising edge signal and controls the output control circuit to output a preset low level.

The present application also discloses a driving method for a gate driver circuit of a display panel, which includes steps of: receiving a clock signal through a charging circuit and outputting an initial gate scanning signal in a scanning time; controlling a pull-down circuit to pull down a potential of an output terminal of the charging circuit to a low level in a non-scanning time; and connecting to an enable signal and controlling the output of the gate scanning signal according to the enable signal by an output control circuit; where when a current-stage initial gate scanning signal is switched from a high level to a low level, the enable signal is a rising edge signal and controls the output control circuit to output a preset low level.

The present application also discloses a display device including a display panel and a gate driver circuit of the display panel; the gate driver circuit includes a multi-stage cascaded shift register, where an any-stage shift register includes: a charging circuit, a pull-down circuit and an output control circuit; the charging circuit receives a clock signal and outputs an initial gate scanning signal in a scanning time; the pull-down circuit controls to pull down a potential of an output terminal of the charging circuit to a low level in a non-scanning time; the output control circuit is electrically coupled to the output terminal of the charging circuit to receive an initial gate scanning signal, connected to an enable signal and controls the output of the gate scanning signal according to the enable signal; where when a current-stage initial gate scanning signal is switched from a high level to a low level, the enable signal is a rising edge signal and controls the output control circuit to output a preset low level.

In the present application, the output control circuit is disposed on the output terminal of the charging circuit of every stage of shift register, when the initial gate scanning signal switches from a high level to a low level, the output control circuit is connected to the enable signal at a rising edge, and the output control circuit is controlled to output a preset low level; even the initial gate scanning signal produces a smear due to RC delay effect, the real outputted gate scanning signal is forced to pull down due to the output control circuit, the gate scanning signal is turned off with a higher speed, thus improving the smear, preventing wrong charging, further avoiding insufficient charging, and promoting display quality.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following, description are merely some embodiments of the present application, and those skilled in the art can obtain other drawings according, to the drawings without any inventive labor. In the drawings.

DETAILED DESCRIPTION OF EMBODIMENTS

Figure 1:
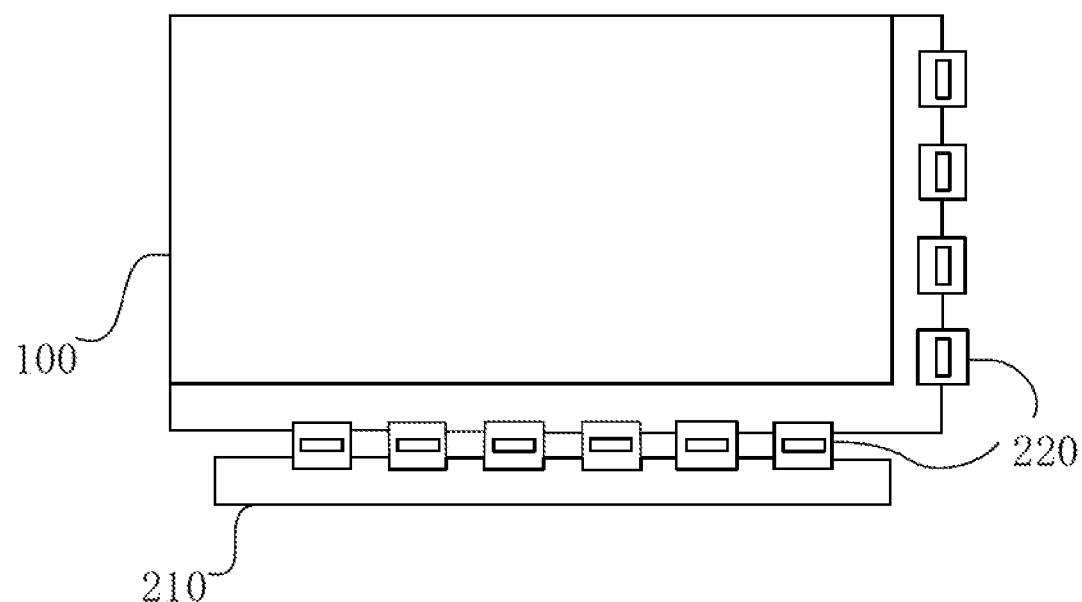
FIG. 1 is a schematic diagram of an exemplary display panel.

The specific structural and functional details disclosed herein are merely representative and are illustrative of the exemplary embodiments of the present application. However, the present application may be embodied in many, optional forms and should not be construed as being limited only to the embodiments set forth herein.

In the description of the present application, it should be understood that, the terms "center", "transverse", "up", "down", "left", "right", "vertical", "horizontal", "top", "bottom", "inner", "outer" and the like for indicating an orientation or positional relationship are based on the orientation or positional relationship shown in the accompanying drawings, and are intended solely to facilitate description and simplification of the description, and are not intended to indicate or imply that the device or element referred to must have a specific orientation, be constructed and operated in a specific orientation, and thus is not to be construed as limiting the present application. Further, the terms "first" and "second" are only for the purpose of description and are not to be construed as indicating or implying a relative importance or implicitly indicating the number of technical features indicated. Therefore, a feature defined as "first" and "second" may explicitly or implicitly include one stage or more stages of the features. In the description of the present application, "multiple stages" means two stages or more stages unless otherwise noted. In addition, the term "including" and any variations thereof are intended to cover non-exclusive inclusion.

In the description of the present application, it should be noted that, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, and can be an internal connection between two-stage elements. For those skilled in the art, the specific meaning of the above terms in this application can be understood according to the specific circumstances.

The terms used herein are merely intended to describe specific embodiments and are not intended to limit the exemplary embodiments. Unless clearly indicated by the context otherwise, the singular forms "a" or "an" are intended to include the plural. It should also be understood that the terms "include" and/or "comprise" as used herein specify the presence of the features, integers, steps, operations, units and/or components set forth without excluding the presence or addition of one or more other features, integers, steps, operations, units, components and/or combinations thereof.

The present application will now be further described by reference to the accompanying drawings and optional embodiments.

Referring to FIGS. 1 to 6, the present application discloses a display device 300, and the display device 300 includes a display panel 100 and a gate driver circuit 200 of the display panel. The driver circuit of the present application is applicable to all types of shift register (GOA) circuits, and an 8clock driver circuit will be described as an example below.

Figure 2:
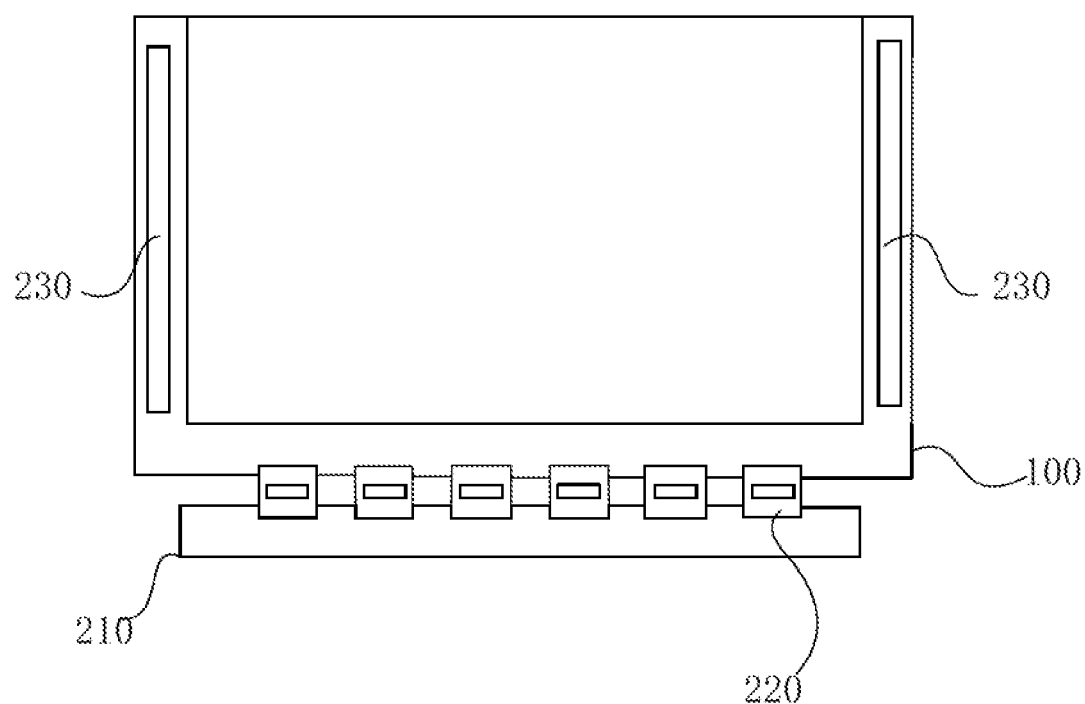
FIG. 2 is a schematic diagram of an exemplary GOA-structured display panel.
Figure 3:
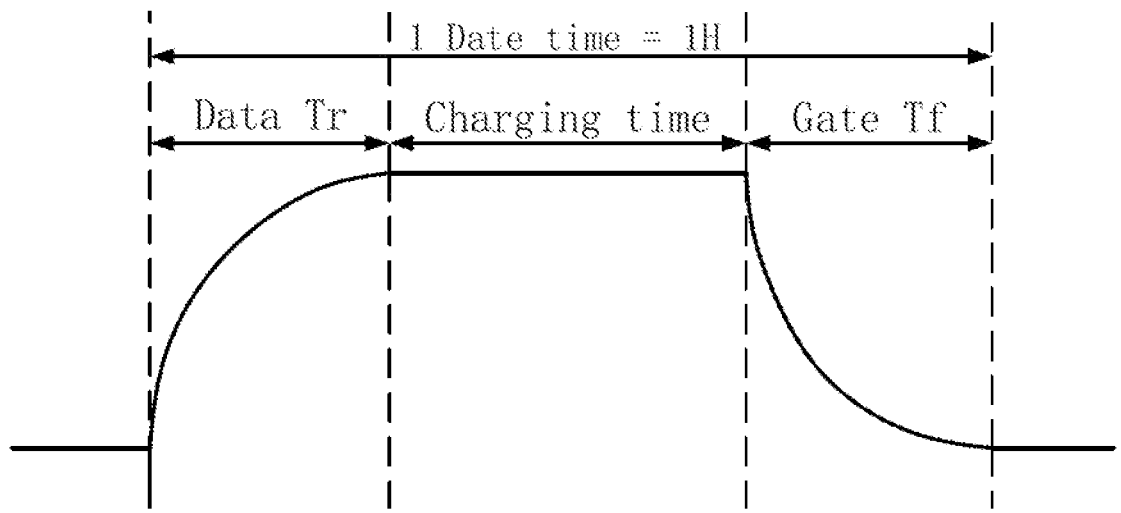
FIG. 3 is a schematic diagram of a charging period waveform of a gate scanning signal.

Referring to FIGS. 1 to 3, FIG. 1 and FIG. 2 are two exemplary display panels, and FIG. 3 is a schematic diagram of a charging period waveform of a gate scanning signal in FIG. 1 and FIG. 2, and due to the effect of RC delay effect, Data Tr is a waveform of a first charging phase, showing a rising curve, and then enters a Charging time which is a normal charging time. After the charging is finished, the waveform of the gate scanning signal restores to a low level, but the output waveform shows a dropping curve due to the RC delay effect, and the smear is occurred. During this period, as in the Gate Tf interval in FIG. 3, the falling edge of the gate scanning signal is delayed, as a result, the scanning line of the display panel is still turned on due to the smear when it should have been turned off, and the pixel corresponding to the current scanning line is charged to the voltage of the pixel corresponding to the next scanning line in a wrong way, finally leading to wrong charging, insufficient charging, and poor display quality of the display, panel.

Figure 4:
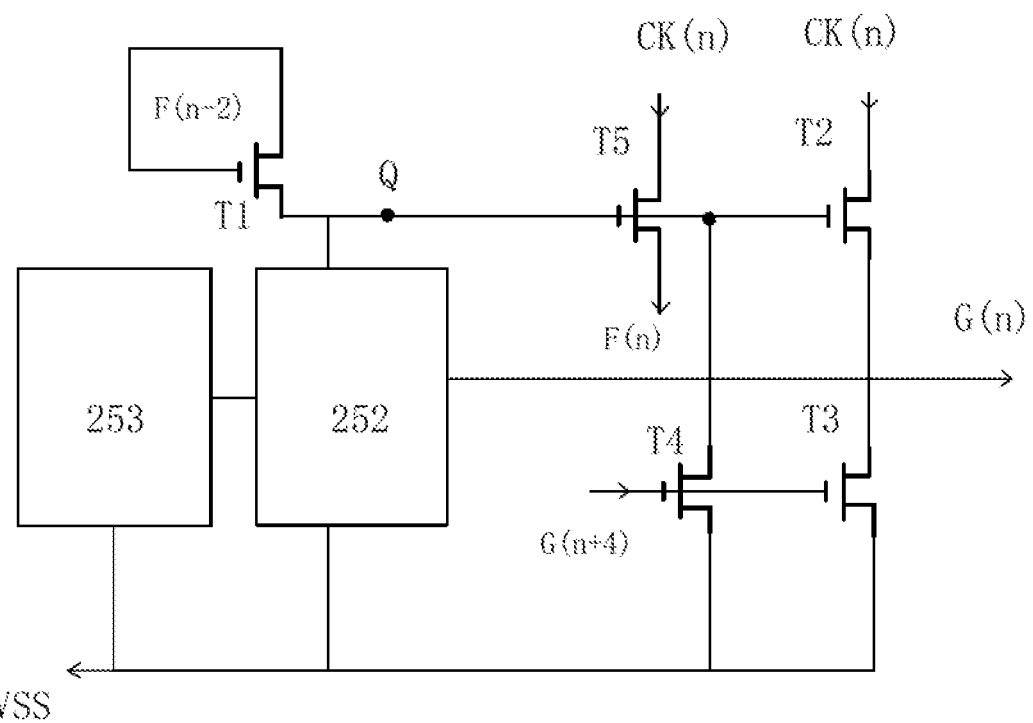
FIG. 4 is a schematic diagram of a gate driver circuit of an exemplary display panel.
Figure 5:
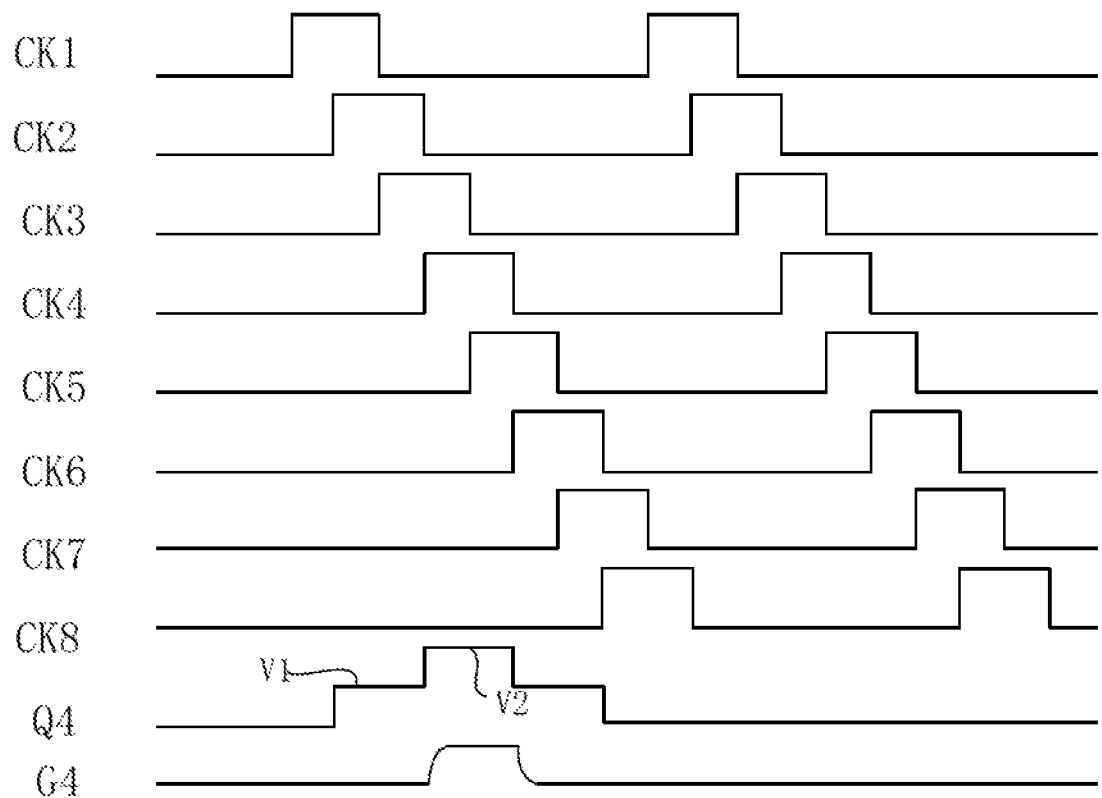
FIG. 5 is a schematic diagram of the waveform corresponding to FIG. 4.

Referring to FIG. 4 and FIG. 5, FIG. 4 is a schematic diagram of an 8CK GOA driver circuit of a display panel; and FIG. 5 is a diagram of the waveform corresponding to FIG. 4. The active switch T1 receives the stage transmission signal F(n−2) of a previous two stages of GOA driver circuits to pre-charge the point Q, and at this time, the point Q rises to the first level V1 (corresponding to the Q4 waveform in FIG. 5). After the previous two stages of the stage transmission signal is finished, the current-stage clock signal CK(n) is connected to the GOA circuit through the active switch T5 and the active switch T2, a potential of point Q is continuously raised to the second level V2 due to the capacitive coupling, at this time, the potential meets the working requirement of the display panel, and the gate scanning signal G(n) is output, i.e., G4 in FIG. 5. After the current-stage clock signal CK4 is turned off, the potential of the point Q drops to a first level V1, the active switch T4 is turned on after receiving the four-stage gate scanning signal, and is connected to a preset low level VSS, and at this time, the potential of the point Q continues to drop to a low level. The corresponding active switch T3 is turned on after receiving the four-stage gate scanning signal, and is connected to a preset low level to pull down the gate scanning signal G4 to the preset low level. The G4 waveform in FIG. 4 is the same as that in FIG. 3, and is the charging time for one pixel, and is dropped from a high level to a low level when charging the gate scanning signal G(n) is finished. In general, the shorter the time for the gate scanning signal to drop to the low level is, the less obvious the smear is, and the better the charging effect of the pixel is, which will ensure better display effect.

Figure 6:
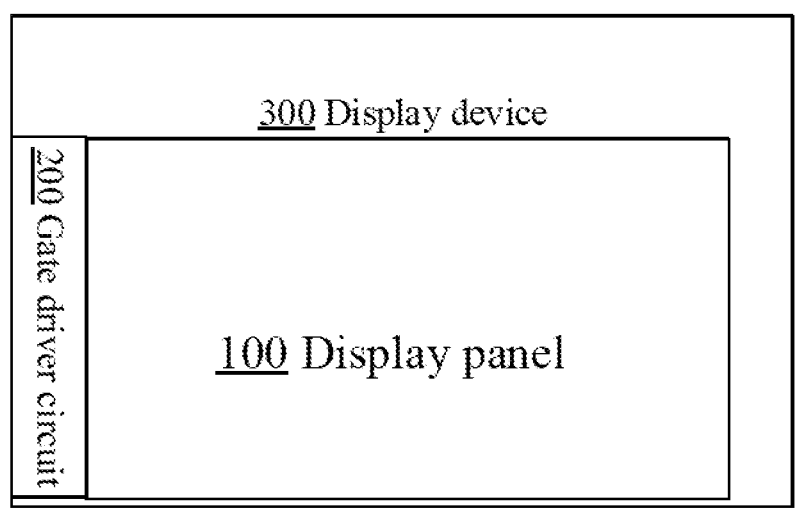
FIG. 6 is a schematic diagram of a display device according to an embodiment of the present application.
Figure 7:
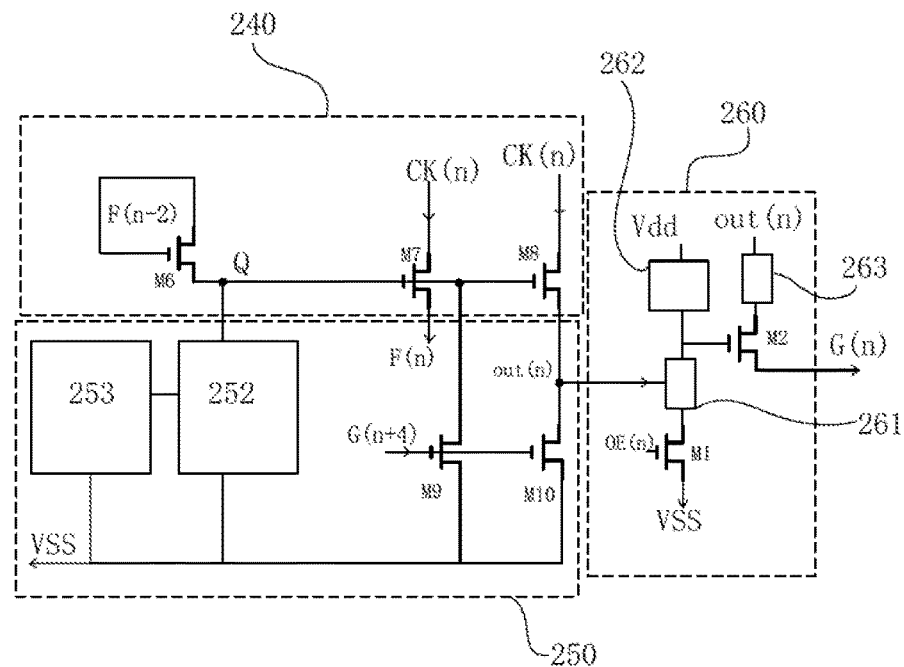
FIG. 7 is a schematic diagram of a gate driver circuit of a display panel according to another embodiment of the present application.

Referring to FIG. 6 and FIG. 7, the gate driver circuit 200 of the display panel disclosed in the present application includes a multi-stage cascaded shift register, where an any-stage shift register includes a charging circuit 240, a pull-down circuit 250 and an output control circuit 260; the charging circuit 240 receives a clock signal and outputs an initial gate scanning signal out(n) in a scanning time; the pull-down circuit 250 controls to pull down a potential of an output terminal of the charging circuit 240 to a low level in a non-scanning time; the output control circuit 260 is electrically coupled to the output terminal of the charging circuit 240 to receive an initial gate scanning signal out(n), the output control circuit 260 is connected to an enable signal OE(n) and controls the output of the gate scanning signal G(n) according to the enable signal OEM); where when the current-stage initial gate scanning signal out(n) is switched from a high level to a low level, the enable signal OE(n) is a rising edge signal and controls the output control circuit 260 to output a preset low level VSS.

In the present application, the output control circuit 260 is disposed on the output terminal of the charging circuit 240 of every stage of shift register, when out(n) switches from a high level to a low level, the output control circuit 260 is connected to the enable signal OE(n) at a rising edge, and the output control circuit 260 is controlled to output a preset low level; even the initial gate scanning signal out(n) produces a smear due to RC delay effect, the real outputted gate scanning signal G(n) is forced to pull down due to the output control circuit 260, the gate scanning signal G(n) is turned off with a higher speed, thus improving the smear, preventing wrong charging, further avoiding insufficient charging, and promoting display quality.

Further, the output control circuit 260 includes a first switch M1, a second switch M2, and a first filter 261 filtering the output terminal of the charging circuit 240; a control terminal of the first filter 261 is connected to the output terminal of the charging circuit 240, and an input terminal of the first filter 261 is connected to a high level Vdd of the driver circuit; the input terminal of the first switch M1 is connected to the output terminal of the first filter 261; the control terminal of the first switch M1 is connected to the enable signal OE(n), and the output terminal of the first switch M1 is connected to a low level VSS; the control terminal of the second switch M2 is connected to the input terminal of the first filter 261, the input terminal of the second switch M2 is connected to the output terminal of the charging circuit 240, and the output terminal of the second switch M2 outputs the gate scanning signal G(n); where the first switch M1 and the second switch M2 are high-level conducting switches, when the initial gate scanning signal out(n) is switched from a high level to a low level, the control terminal of the first switch M1 is connected to an enable signal OE(n) at a rising edge, the first switch M1 and the first filter 261 are conducted and connected to a low level VSS, and the output terminal of the second switch M2 outputs a preset low level.

The first switch M1 and the second switch M2 of the output control circuit 260 are both high-level conducting switches, i.e., metal-oxide-semiconductor field-effect transistors (N-type MOS transistors). The first filter 261 filters the initial gate scanning signal out(n) output from the output terminal of the charging circuit 260, and only allows the output of a high level signal, and when the output signal from the output terminal of the charging circuit 260 is a low level, the entire driver circuit does not output the gate scanning signal. When the scanning of the previous-stage gate scanning signal is finished, that is, the initial gate scanning signal out(n) is switched from a high level to a low level, the control terminal of the first switch M1 in the output control circuit 260 is connected to the enable signal at a rising edge, at this time, the corresponding enable signal is at the high level, and the first switch M1 is conducted. The initial gate driving signal is also at the high state at the time when the scanning thereof is finished and the first filter 261 is also in a conducted state. The voltage of the control terminal of the corresponding second switch M2 is pulled down to the low level VSS, at this time, the second switch M2 is turned off, and the output terminal of the second switch M2 outputs a preset low level, so that the gate scanning signal G(n) is turned off rapidly, improving the smear. In other cases, when the first filter 261 or the first switch M1 are turned off, the control terminal of the second switch M2 is switched to the high level Vdd and is in a conducted state, and the gate scanning signal G(n) can be normally input to the display panel through the second switch.

Figure 8:
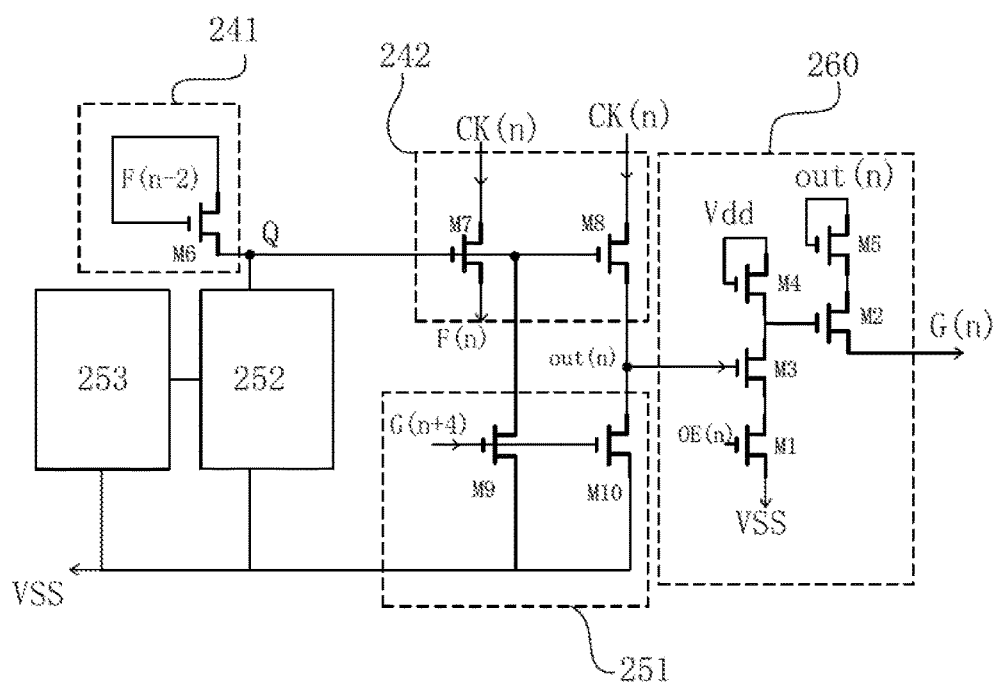
FIG. 8 is a schematic diagram of a gate driver circuit of a display panel according to another embodiment of the present application.

Referring to FIG. 7 and FIG. 8, the first filter 261 is a third switch M3, the third switch M3 is a high-level conducting switch, i.e., N-type MOS transistors, a control terminal of the third switch M3 is connected to the output terminal of the charging circuit 240, an input terminal of the third switch M3 is connected to the high level Vdd of the driver circuit and the control terminal of the second switch M2, and an output terminal of the third switch M3 is connected to the output terminal of the first switch M1. The role of first filter 261 is to filter the signal output from the output terminal of the charging circuit 240, and only allows a high-level signal to be conducted, so that the high-level conducting switch can be configured to control. When the output of the output terminal of the charging circuit 240 is at a high level, the control terminal of the third switch M3 is turned on, the third switch M3 is in a conducted state, and when the output of the charging circuit is at a low level, the third switch M3 is in a turned-off state. Other components may be configured for filtering, such as filters.

The output control circuit 260 further includes a backflow preventer 262 for preventing current backflow, an input terminal of the backflow preventer 262 is connected to the high level Vdd of the driver circuit, and an output terminal thereof is connected to an input terminal of the third switch M3 and a control terminal of the second switch M2. The backflow preventer 262 is arranged to forcibly enable the current generated by the high level of the driver circuit to be output to the third switch and the second switch, so that the current backflow is prevented, the current generated at the high level of the driver circuit is a unidirectional current, which prevents the current backflow from influencing the normal work of the circuit and even damaging components.

There are many choice for components of backflow preventer 262. The backflow preventer may be active switches or diodes, and different panels may be designed according to actual requirements, and the active switches are described as an example herein.

The backflow preventer 262 is a fourth switch M4, the fourth switch M4 is a high-level conducting switch, a control terminal and an input terminal of the fourth switch M4 are connected to the high level of the driver circuit, and an output terminal of the fourth switch M4 is connected to the input terminal of the third switch M3 and the control terminal of the second switch M2. Since the fourth switch M4 is a high-level conducting switch, the fourth switch M4 is in a conducted state when switched to the high level, and the high level is output from the output terminal of the fourth switch M4 to the third switch M3 and the second switch M2.

The output control circuit 260 further includes a second filter 263, and the second filter 263 is disposed between the output terminal of the charging circuit 240 and the input terminal of the second switch M2. The roles of second filter 263 and the first filter 261 is the identical, and filter the output signal at the output terminal of the charging circuit 240, so as to only allow the high level signal to be conducted. Specifically, the second filter 263 includes a fifth switch M5, the fifth switch M5 is a high-level conducting switch, a control terminal and an input terminal of the fifth switch M5 are both connected to the output terminal of the charging circuit 240, and an output terminal of the fifth switch M5 is connected to an input terminal of the second switch M2. When the output terminal of the charging circuit 240 outputs the initial gate scanning signal out(n) at a high level, the fifth switch M5 is in a conducted state, and the output terminal of the fifth switch M5 outputs the initial gate scanning signal out(n) to the second switch M2.

Figure 9:
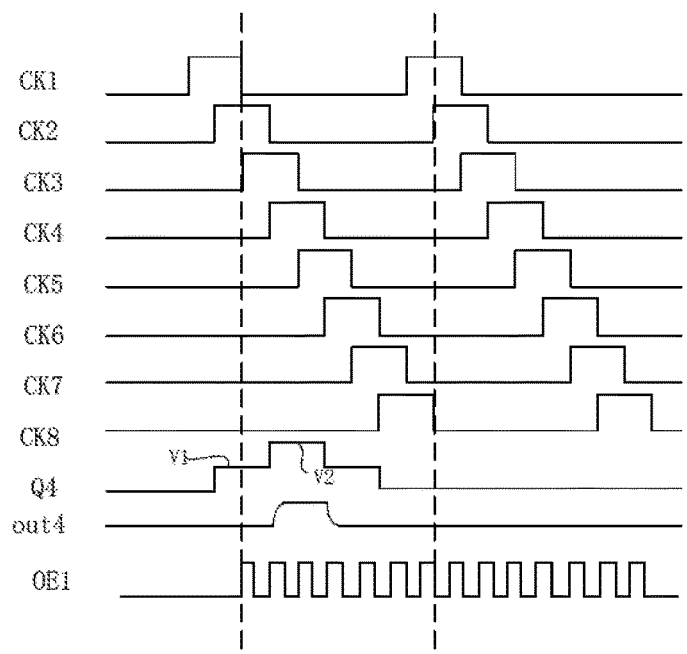
FIG. 9 is a schematic diagram of a waveform of an enable signal according to another embodiment of the present application.

Referring to FIG. 8 and FIG. 9, in the 8clock driver circuit shown in FIG. 8, when the gate scanning signal G(n) output in FIG. 8 is the fourth-stage gate scanning signal G4 and the initial gate scanning signal out(n) output is the fourth-stage initial gate scanning signal out4, the signal waveforms of the points in FIG. 8 correspond to the signal waveform in FIG. 9.

As can be seen from FIG. 8 and FIG. 9, after charging, the gate scanning signal G(n) is finished, that is, when the initial gate scanning signal out(n) starts to drop from a high level to a low level, the pull-down circuit pulls down the initial gate seaming signal out(n) to a preset low level, and the potential of the gate scanning signal G(n) shows a dropping curve due to the RC delay effect. At the time when the initial gate scanning signal out(n) is switched from a high level to a low level, the output terminal of the corresponding charging circuit is at still high level, and the third switch M3 and the fifth switch M5 are still in a conducted state. At this time, the control terminal of the first switch M1 is connected to the enable signal OE(n), and the enable signal OE(n) is at the high level at a rising edge, and the first switch M1 is also in a conducted state. The output terminal of the fourth switch M4 to the output terminal of the first switch M1 are all pulled down to the low level VSS, the control terminal of the corresponding second switch M2 is also at the low level at this time, the second switch M2 is in a turned-off state, the output control circuit 260 outputs a preset low level or no signal, which can accelerate the turn-off of the gate scanning signal, improve the smear, and avoid insufficient charging and poor image display caused by the smear.

When the gate scanning signal is normally output for charging, the enable signal OE(n) is switched to the low level VSS or disconnected from the first switch M1, the first switch M1 is in an turned-off state, and the initial gate scanning signal is normally output to the display panel through the fifth switch M5 and the second switch M2 for charging.

The display device further includes a driver circuit board, an output terminal of an enable signal is disposed on the driver circuit board, and the driver circuit board generates the enable signal and outputs the enable signal to the output control circuit through the output terminal of the enable signal.

The output terminal of the enable signal is disposed on the driver circuit board, the output terminal of enable signal is controlled to the enable signal to be at different potentials, then the output signal of the output circuit is controlled, the turned-off of the gate scanning signal is accelerated, and the smear is improved. Certainly, the output terminal of the enable signal can be located at other positions, and different display panels can be designed according to requirements.

In addition, as can be seen from FIG. 9, the enable signal is a periodic signal, a high-level duration of the enable signal is 1/N times a high-level duration of the initial gate scanning signal, and the starting time of the rising edge of the enable signal corresponds to a time of switching the initial gate scanning signal from a high level to a low level; where N is an integer greater than 4.

The enable signal is an adjustable periodic signal, and the starting time of the rising edge of the clock signal corresponds to a time of switching an initial gate scanning signal from a high level to a low level. The time when the gate scanning signal is switched from a high level to a low level may also be referred to as a turned-off time of the gate scanning signal. The enable signal may be only one signal (e.g., OE1 signal waveform in FIG. 9), that is, the enable signal connected to the current-stage shift register is the same as the enable signal connected to the next-stage shift register. At this time, each rising edge of the enable signal OE1 corresponds to a falling edge when the initial gate scanning signal is turned off, where a first rising edge of an OE1 signal is corresponded to when an initial gate scanning signal is turned off, and a second rising edge of a second OE1 signal is corresponded to when a next-stage initial gate scanning signal is turned off, which accelerates the turn-off of the gate scanning signal G(n) and improves the smear.

Figure 10:
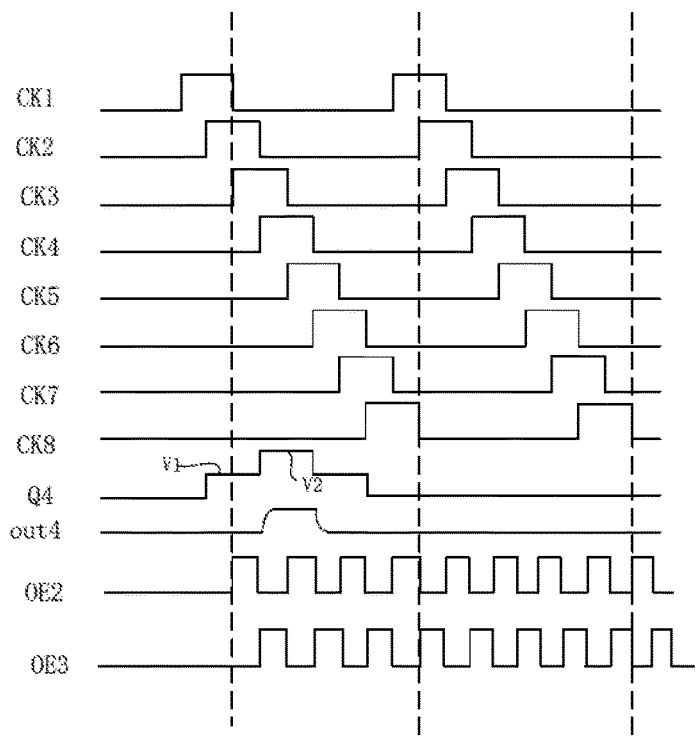
FIG. 10 is a schematic diagram of a waveform of another enable signal according to another embodiment of the present application.

The enable signal may also be a periodic signal switching in two cycles. Referring to FIG. 10, the enable signals are two clock signals (OE2 and OE3) with half a period of waveform difference, the enable signal connected to a current-stage shift register is different from the enable signal connected to a next-stage shift register, and the enable signal connected to the current-stage shift register is a first enable signal OE2, the enable signal connected to the next-stage shift register is a second enable signal OE3, the first enable signal OE2 and the second enable signal. OE3 are periodic signals with the identical period and half a period of waveform difference; high-level durations of the first enable signal OE2 and the second enable signal OE3 is 1/N times the high-level duration of the initial gate scanning signal; the starting time of the rising edge of the first enable signal OE2 corresponds to the time of switching the initial gate scanning signal from high level to low level; the starting time of the rising edge of the second enable signal OE3 corresponds to the time of switching a next-stage initial gate scanning signal from a high level to a low level; where N is an integer greater than 2. When the initial gate scanning signal is turned off, the signal OE2 is turned on, the rising edge of the signal OE2 corresponds to the falling edge of the initial gate scanning signal switched from a high level to a low level, when the next-stage initial gate scanning signal is turned off, the signal OE3 is turned on, the rising edge of the signal OE3 corresponds to the falling edge of the next-stage initial gate scanning signal when the next-stage initial gate scanning signal is turned off, and the steps are sequentially repeated, different enable signals are switched for different initial gate scanning signals, so that the turned-off of the gate scanning signals is accelerated and the smear is improved.

Further, the charging circuit 240 includes an input circuit 241 and an output circuit 242, where the input circuit 241 receives a stage transmission signal of a previous-stage shift register to provide a pre-charge voltage for the current-stage shift register; a control terminal of the output circuit 242 is connected to an output terminal of the input circuit 241, an input terminal of the output circuit 242 receives a clock signal, and the gate scanning signal is controlled to output according to a pre-charge voltage of the input circuit 241;

the pull-down circuit 250 includes a first pull-down circuit 251, a second pull-down circuit 252, and a second pull-down control circuit 253, where the first pull-down circuit 251 receives a feedback signal of a subsequent-stage shift register and pulls the potential of the output circuit 242 to the preset low level; the second pull-down circuit 252 is configured to maintain the pre-charge voltage at a low level and is electrically coupled to a pre-charge point with the input circuit 241 and the output circuit 242; a pull-down control circuit 253 is configured to control the second pull-down circuit 252. The second pull-down circuit 252 and the second pull-down control circuit 253 of the shift register are electrically coupled to the low level VSS, the second pull-down circuit 252 is configured to eliminating noise of the working voltage in the shift register, and the second pull-down control circuit 253 is configured for generating a correct timing sequence to control the second pull-down circuit 252.

Specifically, the input circuit 241 is a sixth switch M6, a control terminal and an output terminal of the sixth switch M6 are connected to a stage transmission signal of the previous-stage shift register, and an output terminal of the sixth switch M6 provides the pre-charge voltage to the shift register. The sixth switch M6 receives the stage transmission signal of the previous-stage shift register and provides the pre-charge voltage for pre-charging. Specifically, the sixth switch M6 receives the stage transmission signal F(n−2) of the previous two stages of shift register, and when the stage transmission signal of the previous two stages of shift register is turned on, the input circuit 241 starts pre-charging.

The output circuit 242 includes a seventh switch M7 and an eighth switch M8; the seventh switch M7 has control terminal connected to the pie-charge point Q, an input terminal connected to the clock signal CK(n), and an output terminal connected to the subsequent-stage shift register; the eighth switch M8 has a control terminal and an input terminal connected to the pre-charge point Q and the clock signal CK(n) respectively, and an output terminal electrically coupled to an output terminal (i.e., at out(n)) with the output control circuit 260 and the first pull-down circuit 251.

The output circuit 242 is configured for receiving the clock signal CK(n) and the pre-charge level, and coupling the clock signal CK(n) and the pre-charge level to form a working voltage signal. The control terminals of the seventh switch M7 and the eighth switch M8 are both connected to the clock signal of the current-stage shift register. The output terminal of the seventh switch M7 is connected to the subsequent-stage or next-stage shift register, and transmits the stage transmission signal F(n) of the current-stage shift register. The eighth switch outputs an initial gate scanning signal out(n) to the output terminal according to the working voltage signal and the clock signal CK(n).

The first pull-down circuit 251 includes a ninth switch M9 and a tenth switch M10; the ninth switch M9 has a control terminal connected to a gate scanning signal G(n+4) of a subsequent-stage shift register, an input terminal connected to the output circuit 242, and an output terminal connected to the low level VSS; the tenth switch M10 has a control terminal connected to the gate scanning signal G(n+4) of the subsequent-stage shift register, an input terminal electrically coupled to the output circuit 242 and the output control circuit 260, and an output terminal connected to the low level VSS. The main role of the first pull-down circuit 251 is to pull down the voltages at the output terminals of the pre-charge point and the charging circuit 240, and when the ninth switch M9 and the tenth switch M10 receive the last four stages of gate scanning signals, the active switches are turned on to pull down the working voltage at the pre-charge point and the voltage of the initial gate scanning signal out(n) to a preset low level.

Figure 11:
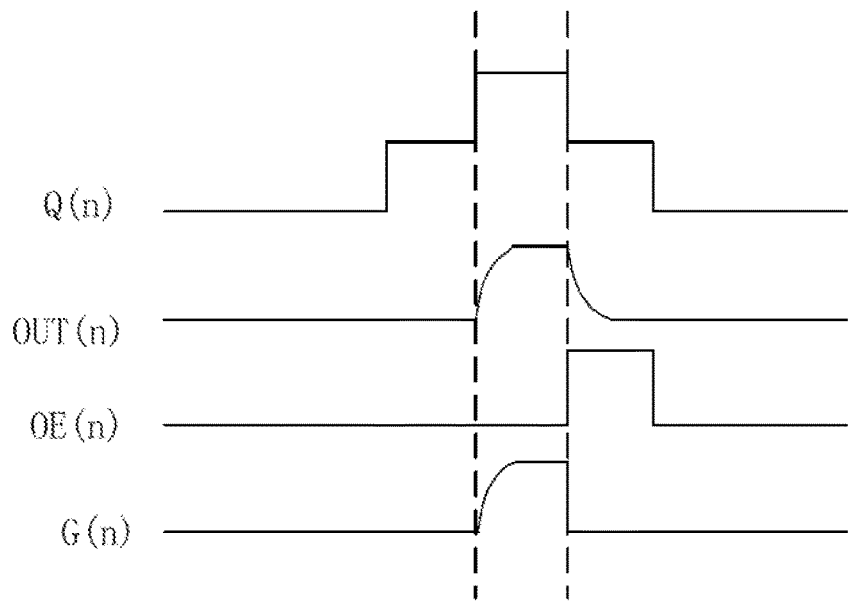
FIG. 11 is a schematic diagram of a waveform of a improved gate scanning signal according to an embodiment of the present application.

Referring to FIG. 11, FIG. 11 is a schematic diagram of output waveforms of each point of the shift register, where Q(n) is a pre-charge voltage waveform, out(n) is an initial gate scanning signal waveform output by the output terminal of the signal charging circuit, and the enable signal OE(n) is turned on when the initial gate scanning signal is at a high level and is switched to a low level, and the turned-off of the gate scanning signals G(n) is accelerated. The waveform of the improved gate scanning signal is shown as G(n) waveform in FIG. 11, and the smear of the improved gate scanning signal is obviously improved, so that insufficient charging and poor display are avoided.

Figure 12:
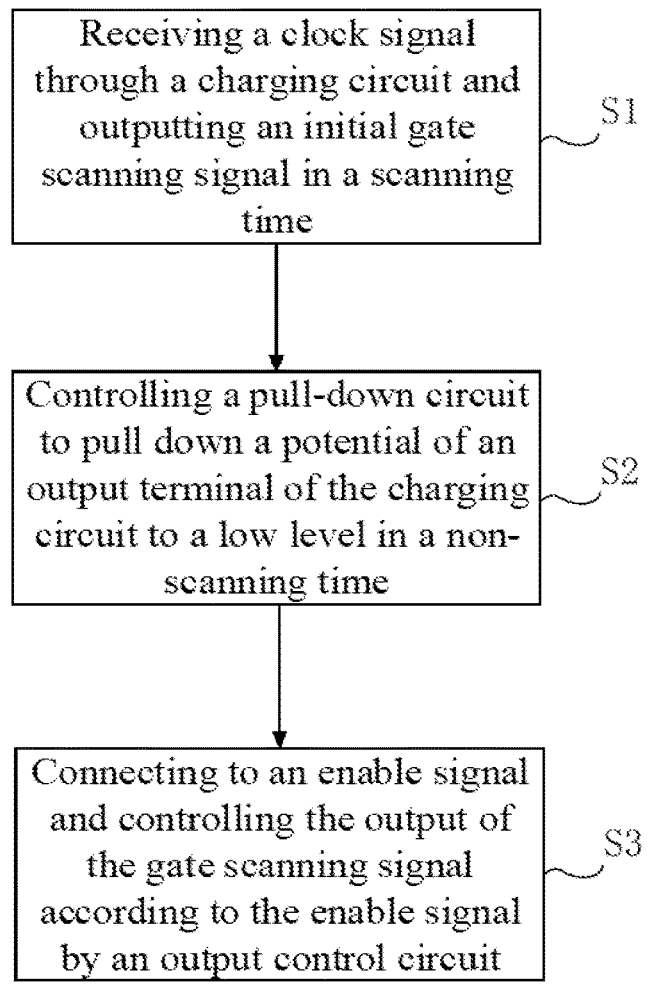
FIG. 12 is a schematic flowchart of a driving method for a gate driver circuit of a display panel according to another embodiment of the present invention.

Referring to FIG. 12, the present application further discloses a driving method for a driver circuit of a display panel, including the steps of:

S1: receiving a clock signal through a charging circuit, and outputting an initial gate scanning signal in a scanning time;

S2: controlling a pull-down circuit to pull down a potential of an output terminal of the charging circuit to a low level in a non-scanning time; and S3: connecting to an enable signal and controlling the output of the gate scanning signal according to the enable signal by an output control circuit;

where when a current-stage initial gate seaming signal is switched from a high level to a low level, the enable signal is a rising edge signal and controls the output control circuit to output a preset low level.

In the present application, the output control circuit is disposed on the output terminal of the charging circuit of every stage of shift register, when the initial gate scanning signal switches from a high level to a low level, the output control circuit is connected to the enable signal at a rising edge, and the output control circuit is controlled to output a preset low level or no signal, which improves the smear, prevents wrong charging, further avoids insufficient charging, and promotes display quality.

The technical solution of the present application can be applied to a wide variety of display panels, such as Twisted Nematic (TN) display panels, In-Plane Switching (IPS) display panels, Vertical Alignment (VA) display panels, Multi-Domain Vertical Alignment (MVA) display panels, and other types of display panels.

The above content is an optional description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A gate driver circuit of a display panel, comprising a multi-stage cascaded shift register, wherein an any-stage shift register comprises:

a charging circuit, receiving a clock signal and outputting an initial gate scanning signal in a scanning time;

a pull-down circuit, controlling to pull down a potential of an output terminal of the charging circuit to a low level in a non-scanning time; and an output control circuit, electrically coupled to the output terminal of the charging circuit to receive an initial gate scanning signal, connected to an enable signal and controlling the output of the gate scanning signal according to the enable signal;

wherein when a current-stage initial gate scanning signal is switched from a high level to a low level, the enable signal is a rising edge signal and controls the output control circuit to output a preset low level;

wherein the output control circuit comprises a first switch, a second switch, and a first filter filtering the output terminal of the charging circuit;

a control terminal of the first filter is connected to the output terminal of the charging circuit, and an input terminal of the first filter is connected to a high level of the driver circuit;

the input terminal of the first switch is connected to the output terminal of the first filter; the control terminal of the first switch is connected to the enable signal, and the output terminal of the first switch is connected to a low level;

a control terminal of the second switch is connected to the input terminal of the first filter, an input terminal of the second switch is connected to the output terminal of the charging circuit, and an output terminal of the second switch outputs the gate scanning signal;

wherein the first switch and the second switch are high-level conducting switches; when the initial gate scanning signal is switched from a high level to a low level, the control terminal of the first switch is connected to an enable signal at a rising edge, the first switch and the first filter are conducted and connected to a low level, and the output terminal of the second switch outputs a preset low level.

2. The gate driver circuit according to claim 1, wherein the first filter is a third switch, the third switch is a high-level conducting switch, a control terminal of the third switch is connected to the output terminal of the charging circuit, an input terminal of the third switch is connected to the high level of the driver circuit and the control terminal of the second switch, and an output terminal of the third switch is connected to the output terminal of the first switch.

3. The gate driver circuit according to claim 1, wherein the output control circuit further comprises a backflow preventer for preventing current backflow, an input terminal of the backflow preventer is connected to the high level of the driver circuit, and an output terminal of the backflow preventer is connected to the control terminal of the second switch.

4. The gate driver circuit according to claim 1, wherein the output control circuit further comprises a second filter disposed between the output terminal of the charging circuit and the input terminal of the second switch, the second filter has the identical function as the first filter, and the second filter filters an output signal of the output terminal of the charging circuit and only allows a high-level signal to be conducted.

5. The gate driver circuit according to claim 4, wherein the second filter comprises a fifth switch, the fifth switch is a high-level conducting switch, a control terminal and an input terminal of the fifth switch are both connected to the output terminal of the charging circuit, and an output terminal of the fifth switch is connected to the input terminal of the second switch.

6. The gate driver circuit according to claim 5, wherein when the output terminal of the charging circuit outputs the initial gate scanning signal at a high level, the fifth switch is in a conducted state, and the output terminal of the fifth switch initially outputs the gate scanning signal to the second switch.

7. The gate driver circuit according to claim 3, wherein the backflow preventer is a fourth switch, the fourth switch is a high-level conducting switch, a control terminal and an input terminal of the fourth switch are connected to the high level of the driver circuit, and an output terminal of the fourth switch is connected to the control terminal of the second switch.

8. The gate driver circuit according to claim 1, wherein the enable signal is a periodic signal, a high-level duration of the enable signal is 1/N times a high-level duration of the initial gate scanning signal, and the starting time of the rising edge of the enable signal corresponds to a time of switching the initial gate scanning signal from a high level to a low level;

wherein N is an integer greater than 4.

9. The gate driver circuit according to claim 1, wherein the enable signal connected to a current-stage shift register is different from the enable signal connected to a next-stage shift register, and the enable signal connected to the current-stage shift register is a first enable signal, the enable signal connected to the next-stage shift register is a second enable signal, and the first enable signal and the second enable signal are periodic signals with the identical period and half a period of waveform difference;

high-level durations of the first enable signal and the second enable signal is 1/N times the high-level duration of the initial gate scanning signal;

the starting time of the rising edge of the first enable signal corresponds to the time of switching the initial gate scanning signal from a high level to a low level;

the starting time of the rising edge of the second enable signal corresponds to the time of switching a next-stage initial gate scanning signal from a high level to a low level;

wherein N is an integer greater than 2.

10. The gate driver circuit according to claim 1, wherein the enable signal is an adjustable periodic signal, and the starting time of the rising edge of the clock signal corresponds to a time of switching an initial gate scanning signal from a high level to a low level.

11. The gate driver circuit according to claim 1, wherein the enable signal connected to a current-stage shift register is the same as the enable signal connected to a next-stage shift register, and each rising edge of the enable signal OE1 corresponds to a falling edge when the initial gate scanning signal is turned off, where a first rising edge of an OE1 signal is corresponded to when an initial gate scanning signal is turned off and a second rising edge of a second OE1 signal is corresponded to when a next-stage initial gate scanning signal is turned off.

12. The gate driver circuit according to claim 1, wherein the charging circuit comprises an input circuit and an output circuit, wherein the input circuit receives a stage transmission signal of a previous-stage shift register and provides a pre-charge voltage for a current-stage shift register;

a control terminal of the output circuit is connected to an output terminal of the input circuit, an input terminal of the output circuit receives a clock signal, and the output of the gate scanning signal is controlled according to a pre-charge voltage of the input circuit.

13. The gate driver circuit according to claim 12, wherein the pull-down circuit comprises:

a first pull-down circuit, a second pull-down circuit, and a second pull-down control circuit, wherein the first pull-down circuit receives a feedback signal of a subsequent-stage shift register and pulls the potential of the output circuit to the preset low level;

the second pull-down circuit is configured to maintain the pre-charge voltage at a low level and is electrically coupled to a pre-charge point with the input circuit and the output circuit;

the pull-down control circuit controls the second pull-down circuit.

14. A driving method for a gate driver circuit of a display panel, comprising steps of:

receiving a clock signal through a charging circuit, and outputting an initial gate scanning signal in a scanning time;

controlling a pull-down circuit to pull down a potential of an output terminal of the charging circuit to a low level in a non-scanning time; and connecting to an enable signal and controlling the output of the gate scanning signal according to the enable signal by an output control circuit;

wherein when a current-stage initial gate scanning signal is switched from a high level to a low level, the enable signal is a rising edge signal and controls the output control circuit to output a preset low level;

the gate driver circuit of a display panel, comprising a multi-stage cascaded shift register, wherein an any-stage shift register comprises: an output control circuit, electrically coupled to the output terminal of the charging circuit to receive an initial gate scanning signal, connected to an enable signal and controlling the output of the gate scanning signal according to the enable signal;

wherein when a current-stage initial gate scanning signal is switched from a high level to a low level, the enable signal is a rising edge signal and controls the output control circuit to output a preset low level;

wherein the output control circuit comprises a first switch, a second switch, and a first filter filtering the output terminal of the charging circuit;

a control terminal of the first filter is connected to the output terminal of the charging circuit, and an input terminal of the first filter is connected to a high level of the driver circuit;

the input terminal of the first switch is connected to the output terminal of the first filter; the control terminal of the first switch is connected to the enable signal, and the output terminal of the first switch is connected to a low level;

a control terminal of the second switch is connected to the input terminal of the first filter, an input terminal of the second switch is connected to the output terminal of the charging circuit, and an output terminal of the second switch outputs the gate scanning signal;

wherein the first switch and the second switch are high-level conducting switches; when the initial gate scanning signal is switched from a high level to a low level, the control terminal of the first switch is connected to an enable signal at a rising edge, the first switch and the first filter are conducted and connected to a low level, and the output terminal of the second switch outputs a preset low level.

15. A display device, comprising a display panel and a gate driver circuit of the display panel;

the gate driver circuit comprises a multi-stage cascaded shift register, wherein an any-stage shift register comprises:

a charging circuit, receiving a clock signal and outputting an initial gate scanning signal in a scanning time;

a pull-down circuit, controlling to pull down a potential of an output terminal of the charging circuit to a low level in a non-scanning time; and an output control circuit, electrically coupled to the output terminal of the charging circuit to receive an initial gate scanning signal, connected to an enable signal and controlling the output of the gate scanning signal according to the enable signal;

wherein when a current-stage initial gate scanning signal is switched from a high level to a low level, the enable signal is a rising edge signal and controls the output control circuit to output a preset low level;

wherein the output control circuit comprises a first switch, a second switch, and a first filter filtering the output terminal of the charging circuit;

a control terminal of the first filter is connected to the output terminal of the charging circuit, and an input terminal of the first filter is connected to a high level of the driver circuit;

the input terminal of the first switch is connected to the output terminal of the first filter; the control terminal of the first switch is connected to the enable signal, and the output terminal of the first switch is connected to a low level;

a control terminal of the second switch is connected to the input terminal of the first filter, an input terminal of the second switch is connected to the output terminal of the charging circuit, and an output terminal of the second switch outputs the gate scanning signal;

wherein the first switch and the second switch are high-level conducting switches; when the initial gate scanning signal is switched from a high level to a low level, the control terminal of the first switch is connected to an enable signal at a rising edge, the first switch and the first filter are conducted and connected to a low level, and the output terminal of the second switch outputs a preset low level.

16. The display device according to claim 15, wherein the display device further comprises a driver circuit board, an output terminal of an enable signal is disposed on the driver circuit board, and the driver circuit board generates the enable signal and outputs the enable signal to the output control circuit through the output terminal of the enable signal.

17. The display device according to claim 16, wherein the output terminal of the enable signal is disposed on the driver circuit board, and an output signal of the output circuit is controlled by controlling the output terminal of the enable signal to adjust the enable signal to be at different potentials.

* * * * *